(12) United States Patent
Lee

(10) Patent No.: US 7,460,743 B2
(45) Date of Patent: Dec. 2, 2008

(54) DIFFUSION AND LASER PHOTOELECTRICALLY COUPLED INTEGRATED CIRCUIT SIGNAL LINE

(76) Inventor: Yick Kuen Lee, No. 7B, Begonia Road G/F, Kowloon, Hong Kong (HK)

( * ) Notice: Subject to any disclaimer, the term of this patent is extended or adjusted under 35 U.S.C. 154(b) by 22 days.

(21) Appl. No.: 11/661,934

(22) PCT Filed: Aug. 1, 2005

(86) PCT No.: PCT/CN2005/001167

§ 371 (c)(1),
(2), (4) Date: Mar. 6, 2007

(87) PCT Pub. No.: WO2006/097018

PCT Pub. Date: Sep. 21, 2006

(65) Prior Publication Data

US 2008/0107373 A1 May 8, 2008

(30) Foreign Application Priority Data

Mar. 15, 2005 (CN) .................... 2005 1 0033549

(51) Int. Cl.
*G02B 6/12* (2006.01)
*H01L 27/15* (2006.01)
*H01L 29/26* (2006.01)
(52) U.S. Cl. .................... 385/14; 257/79; 257/80
(58) Field of Classification Search .......... None
See application file for complete search history.

(56) References Cited

U.S. PATENT DOCUMENTS 6,858,872 B2* 2/2005 Kondo ................ 257/80
2002/0063310 A1* 5/2002 Kondo et al. ........ 257/618

FOREIGN PATENT DOCUMENTS

| CN | 1430826 | 7/2006 |
|---|---|---|
| JP | 2001174673 | 6/2001 |

* cited by examiner

Primary Examiner—Michelle R. Connelly-Cushwa
Assistant Examiner—Chris Chu
(74) Attorney, Agent, or Firm—Rabin & Berdo, P.C.

(57) ABSTRACT

A diffusion and laser photoelectrically coupled integrated circuit signal line, wherein photoelectrically coupled pairs are formed on integrated circuit chips utilizing a diffusion light or a laser light emitted by LED or the photoelectrically coupled pairs are arranged in an array to form photoelectrically coupled matrixes on the chips are used as signal lines connecting integrated circuits; furthermore a light emission is made to hollow light emitter and placed on the integrated circuit chip; a hollow reflective sheet is located on the bottom surface of the chip and under the light emitting body where a send-receiving photosensitive module is disposed around and a hollow reflective sheet or a semitransparent diffusion sheet is placed over; and the same processed chips are stacked up. The present invention solves the problem of signal transmission bandwidth between the computer chips, increasing the present arithmetic capability and reducing the volume of the supercomputer.

5 Claims, 6 Drawing Sheets

DIFFUSION AND LASER PHOTOELECTRICALLY COUPLED INTEGRATED CIRCUIT SIGNAL LINE

FIELD OF THE INVENTION

The present invention relates to an integrated circuit signal line, and especially relates to integrated circuit signal lines connecting between the chips in high performance computers and pseudo-organic computers.

TECHNICAL BACKGROUND

In contemporary integrated circuits, metal conductor leads are generally used to connect the signals to circuit boards, with the result that it is large in size, high in production costs and high in noise. Owing to the limited space between the metal conductor leads, the maximum space therebetween is about 0.5 mm. As a result, the number of connecting pins is limited to about 500. The total bits or address bits of CPU are below 64 bits mainly. A bottle-neck formed by I/O transmission bandwidth has limited potential for increasing the arithmetic capability and reducing the volume of the computer.

INVENTION CONTENTS

An object of this invention is to provide an integrated circuit signal line, by means of which the problem of signal transmission bandwidth between the computer chips, increasing the present arithmetic capability of the supercomputer by one order of magnitude; and reducing the volume of the computer may be solved.

To achieve the above object, a diffusion and laser photoelectrically coupled integrated circuit signal line is provided with the following:

Photoelectrically coupled pairs formed among integrated circuit chips utilizing a diffusion light or a laser light emitted by LED are used as signal lines connecting the integrated circuits. By utilizing the light emission and receiving technology, a photoelectrically coupled circuit is configured on the integrated circuit chips, whereby the line density of 0.05 mm or above can be achieved, and the number of connecting pins is 100 times larger than previously thought. Beside the power supply and some power output, the signal lines between the integrated circuit chips can be replaced by the photoelectrically coupled pairs, thus increasing density.

According to the present invention, a photoelectrically coupled matrix formed in such a manner that the photoelectrically coupled pairs are arranged in an array manner on the integrated circuit chips are used as signal line connecting integrated circuits. By utilizing the System On Chip (SOC) technology, the photoelectrically coupled matrixes integrated on each integrated circuit chip needed to be connected are substituted for metal connecting pins. Because of the very high density of the circuit, thousands upon thousands of photoelectrically coupled matrix in form of an array can be arranged in a chip. By alternatively interconnecting the photoelectrically coupled matrixes of the chips, signals can be transmitted from one chip to another one to replace metal connecting pins. On each optical channel, signals are received and transmitted only in one direction and in a point-to-point manner.

According to the present invention, the signal bus connecting all the chips is comprised of an optical channel, which is constructed of a string of send-receiving photosensitive module at the corresponding position and extended through all the stacked chips, wherein a hollow light emitting body made of light emitting units is arranged on the integrated circuit chip; a hollow reflective sheet is placed on the bottom surface of the chip and under the light emitting body; a send-receiving photosensitive module is arranged around the light emitting body; a hollow reflective sheet or a semi-transparent diffusion sheet is placed over the light emitting body; and the same processed chips are stacked up. When the LED works in non-coherence diffused mode, the technical requirement of manufacturing the chip is still relatively simple, the physical structure of which is simpler than that consisting of chip, metal connecting wire, connecting pins, circuit board, connecting pins, conducting wire, and chip. As a result, the frequency of using bus will be increased significantly.

According to the present invention, the bus matrixes formed in such a manner that the optical channel bus is arranged in an array manner on the integrated circuit chips are used as the signal lines connecting the integrated circuit.

A cylindrical refraction layer and absorption layer are mounted on the bus outer wall of the present invention to isolate the bus inner chamber from the chip body, whereby reducing interferences between the optical channels, forming a bus resonance cavity and improving bus performance.

A laser emitter consisting of the output end of the optical channel bus matrixes of the present invention can be used as a projector screen by means of image lens.

Advantages of this invention are as follows:

1. In the present invention, the data are transmitted in the form of light-energy between chips, not in the form of the metal wire using electrical energy. Transmitting signals in form of light has an advantage over metal connecting wires in anti-noise, anti-electromagnetic interference and anti-oxidation. The volume, also, can be minimized.

2. When the optical channel bus works under the resonance state, Laser emission efficiency in the range of 50% or above may be achieved; the Laser emission critical current may be as low as tens of $\mu$As; and modulation frequency in the 10 GHz range may be achieved. As a result, it is higher in divergent coefficient and longer in transmission distance. The bus to which optical channel matrix is connected, if used one has bus width up to thousands (K) of bits per clock cycle, can handle K-bits at a time. When running at GHz, THz bandwidth will be able easily to be reached. Nowadays, the sensitivity and divergent coefficient of Laser transmission energy and light sensing assemble are counted by hundred thousands, while the true limitation lies in the geometry shape of resonator. In a normal situation, it is easy to create a bus of 2 to 64 chips connecting in series.

3. Through stacking up the chips and using the optical channel matrix formed by photo-electric coupling as chip stack bus, a plenty of chips having same or different function in CPU, MPU, RAM, I/O, GPU and even LCD display is connected together. Thus created arithmetic capability can be significantly improved, while it will be further miniaturized.

METHOD OF REALIZATION

Figure 1:
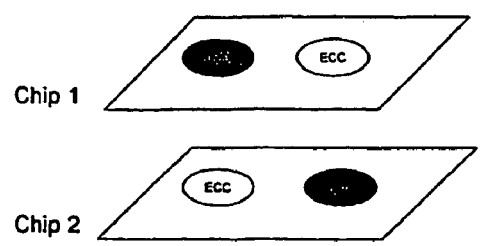
FIG. 1 is a diagram showing a photoelectrically coupled pairs.
Figure 2:
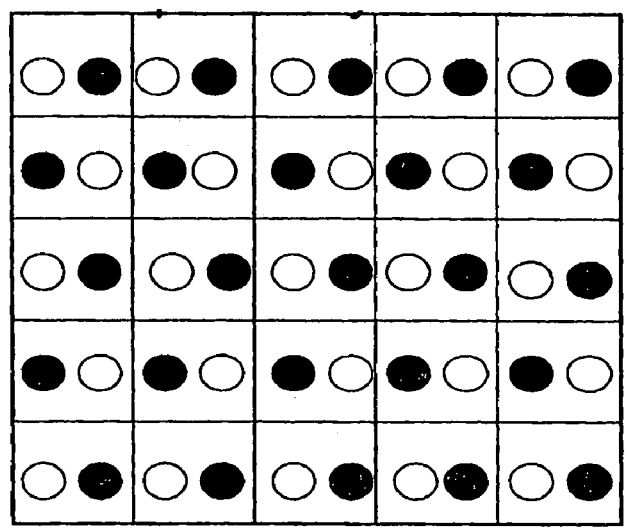
FIG. 2 is a diagram showing a photoelectrically coupled pair matrix.
Figure 3:
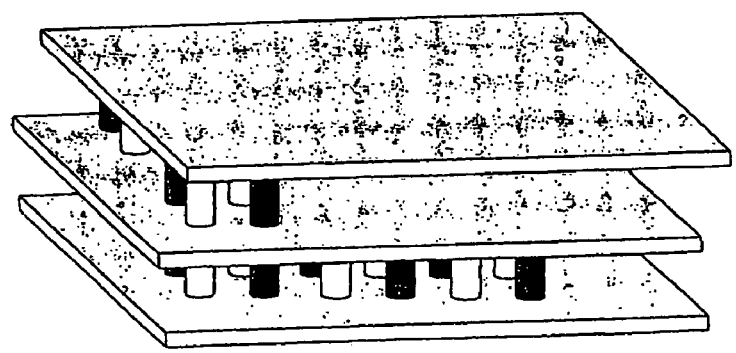
FIG. 3 is a diagram showing crosswise interconnection of photoelectrically coupled matrixes on the chips

As shown in FIGS. 1, 2 and 3, photoelectrically coupled pairs formed on the integrated circuits utilizing a diffusion light or a Laser light emitted by LED are used as the signal lines connecting integrating circuits. The LED transmits signals from a chip, which are received by a photosensitive component that may be a photosensitive diode, photosensitive triode, or photoelectric charge coupler (ECC). Coupled pairs may be configured in the form of dual channel unidirectional receive/transmit or single channel bidirectional receive/transmit wherein the signals transmitting light includes incoherence broadband diffusion light and coherence Laser. Creating photoelectrically coupled circuit on an integrating circuit chip by utilizing such a light emission and reception technology has special distribution of 0.05mm or above, and 100 times more than by using the pins. Except the power supply and some power output, the signal lines between the integrated circuit chips IC can be replaced by the photoelectrically coupled pairs, whereby increasing density thereof.

The photoelectrically coupled matrixes formed in such a manner that the photoelectrically coupled pairs are arranged in an array manner on the integrated circuit chip; an array to configure a photoelectrically coupled matrix are used as signal lines connecting the integrated circuit. The number of column in the matrix can be 1 to any positive integer N, and the number of row may be 1 to any positive integer M. Owing to the high density of the circuit, thousands or tens of thousand of photoelectrically coupled matrix formed in each IC in an array manner can be reached. By crosswise interconnecting the photoelectrically coupled matrixes among the chips, signals can be transmitted from one chip to another one. On each optical channel, signals are received and transmitted only in one direction and in a point-to-point manner. On every integrated circuit chip to be connected, the metal pins and connecting wires may be replaced by utilizing the System of Chip (SOC) technology with the photoelectrically coupled matrixes integrated onto the chips.

Figure 4:
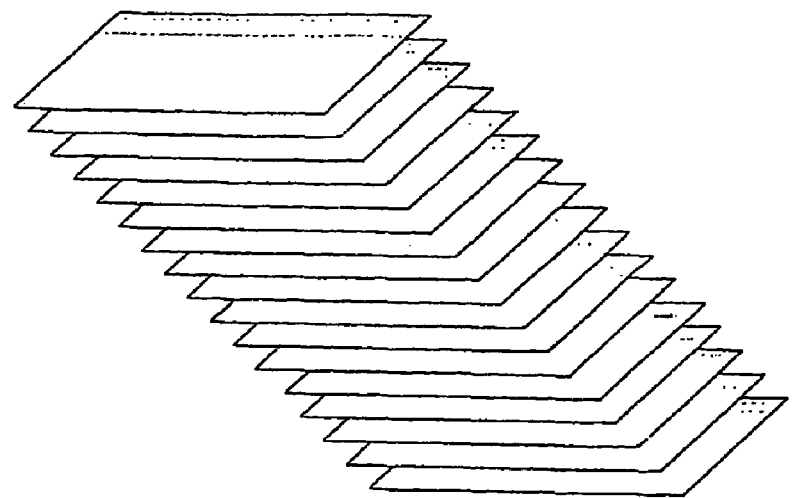
FIG. 4 is a diagram showing a stack of chips in the form of sheet cake.
Figure 5:
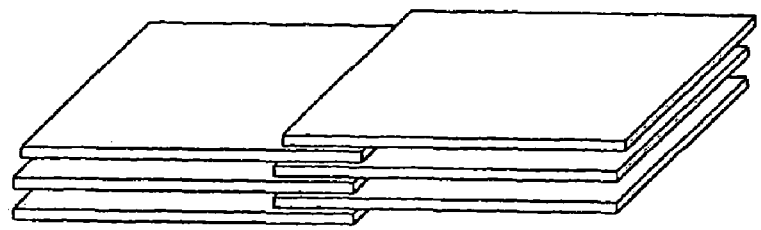
FIG. 5 is a diagram showing a stack of chips in the form of ribs.
Figure 6:
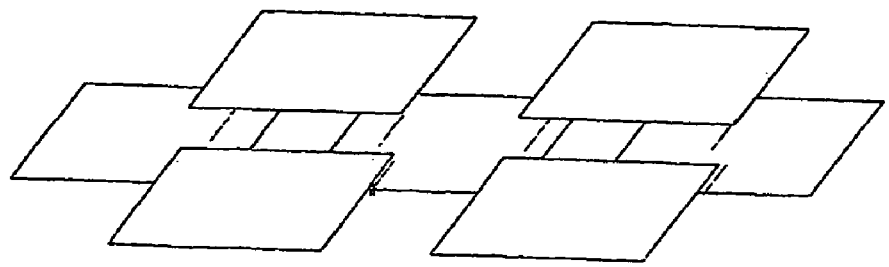
FIG. 6 is a diagram showing. chips connection in the form of tiles.
Figure 7:
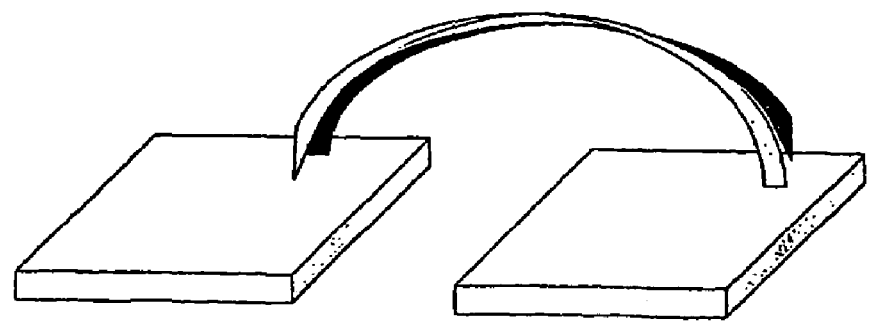
FIG. 7 is a diagram showing fibre-optic connection when chips are disposed far away.

The above mentioned photoelectrically coupled matrixes are disposed onto the integrated circuit chips to replace the conventional metal pins for the transmission of data among a plenty of chips. By stacking up the chips or utilizing transparent material to adhere them, the interconnected photoelectrically coupled matrixes are used as data bus, from which a large data processing system is formed. The photoelectrically coupled matrix signal lines can be arranged on both side of the chip. The stack of chips may be in the form of sheet cake as shown in FIG. 4; and in the form of ribs as shown in FIG. 5. The photoelectrically coupled matrix signal lines can be arranged on one side of the chip. The stack of chips may be in the form of tiles as shown in FIG. 6 and such a construction is of advantage for heat sinking. For the chips need to be placed at long distances, the optic fibres can be connected among the chips on which photoelectrically coupled matrix signal lines are disposed as shown in FIG. 7.

Figure 8:
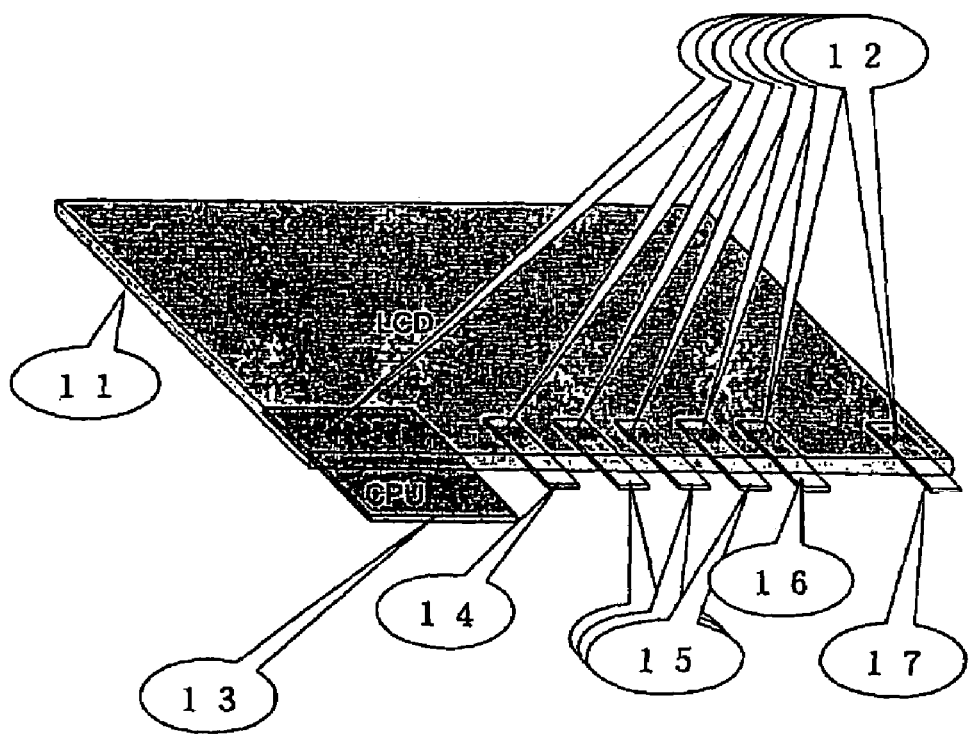
FIG. 8 is a PDA diagram showing a direct coupling.

FIG. 8 is a PDA diagram showing a direct coupling, in which a LCD display is referred to as base 11, and then on this base photoelectrically coupled matrixes 12 are connected and CPU 13, memory chip 14, a plenty of flash memory chips 15, I/O module 16, and other module 17 are adhered onto it. Thus, except for power supply and external connection wires, there are a few connection wires. In mass production, the production cost may be lower as compared to the system of chip-wire-plug-circuit board-plug-wire-chip, and it is higher in stability. Due to the direct connection of each flash memory chip to the CPU, the read/write speed will be much faster.

Figure 9:
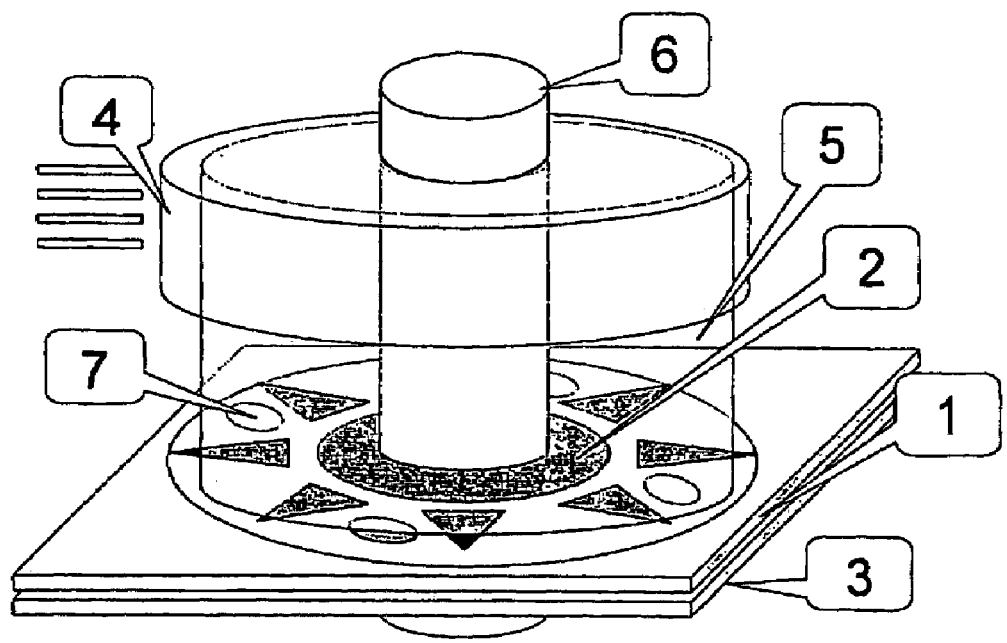
FIG. 9 is a diagram showing a laser resonance cavity optical channel bus.
Figure 10:
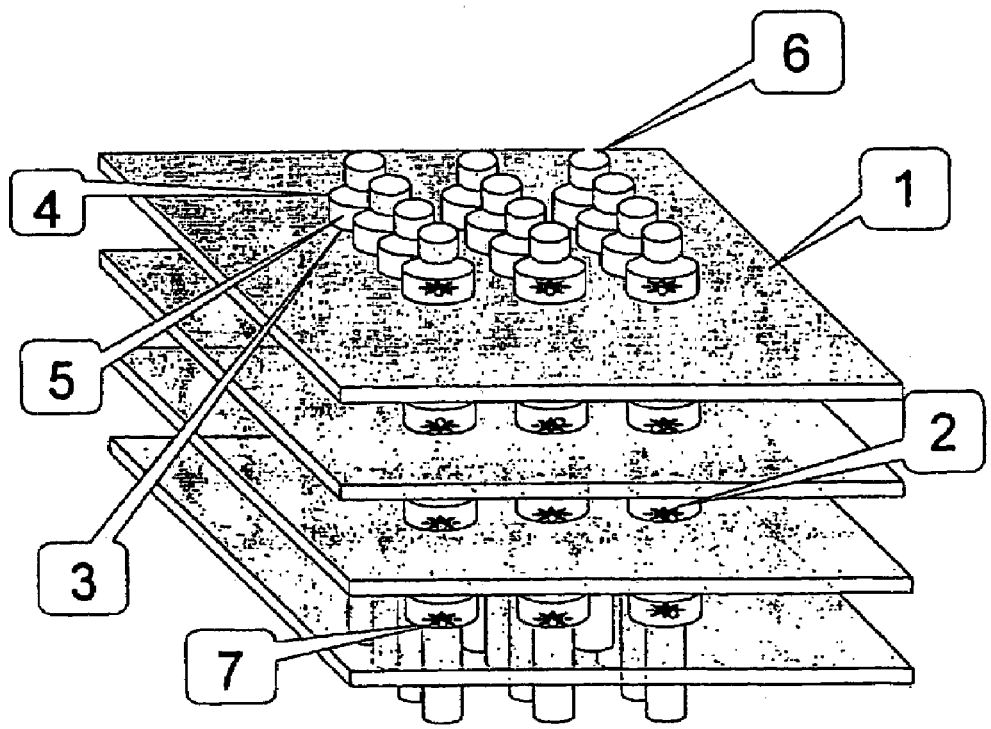
FIG. 10 is a diagram showing matrix connection of a laser resonance cavity optical channel bus.
Figure 11:
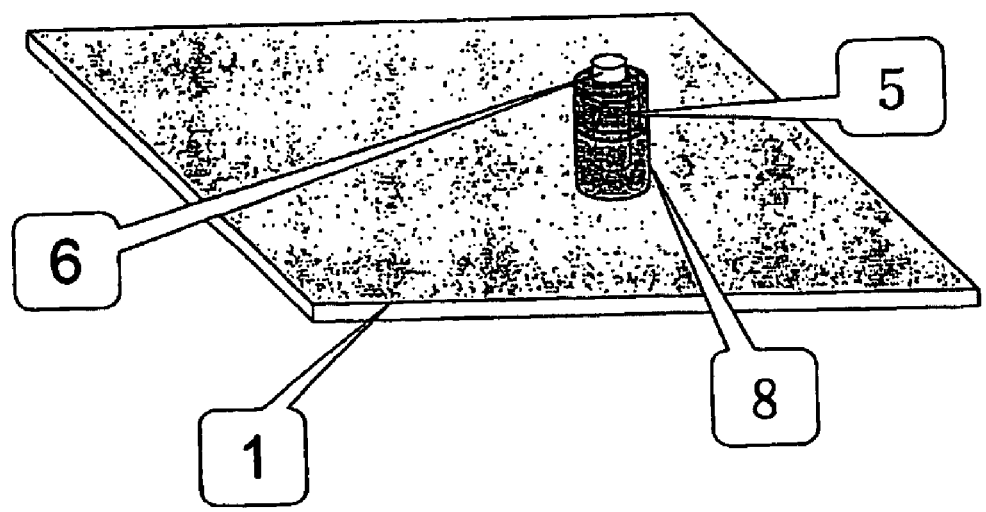
FIG. 11 is a diagram showing refraction layer and absorption layer disposed for optical channel bus.

As shown in the FIGS. 9, 10 and 11, a signal bus connecting all the chips is comprised of an optical channel, which is constructed of a string of send-receiving photosensitive modules at the corresponding position and extended through all the stacked chips, wherein a star shaped hollow light emitting body made of light emitting units and placed on the integrated circuit chips; a hollow reflective sheet is located on the bottom surface of the chip and under the light emitter body; a send-receiving photosensitive module is placed around the light emitting body; a hollow reflective sheet or semitransparent diffusion sheet is placed over the light emitting body, and the processed same chips are stacked up. The light energy is emitted from the diode light source 2, and reflected to and fro between the bottom reflecting layer 3 and surface interference reflecting layer 4 of the chip, whereby making a resonance cavity 5 within the chip. Part of the energy goes through the transparent bus light channel connecting all the stacked chips from the center to other chips in the bus. A photosensitive assemble 7 is mounted beside the light source to receive signals. A cylindrical refraction layer and an absorption layer 8 are inserted on the outer wall of the bus to isolate the bus inner chamber from the chip body, whereby reducing the interferences among the optical channels, forming a resonance cavity and improving the bus performance. When the requirements of procedure for production of the chips are met by controlling properly the physical parameter of the resonance cavity, reducing the threshold current within a reasonable range, and allowing LED to work under the relevant Laser mode, the light frequency band is concentrated on near resonated frequency and the signal channel modulation frequency can be in the range of 10 GHz. Optical channel resonator bus on the integrated circuit chip is arranged in form of an array to form a bus matrix and integrated to various types of chips. By stacking up the chips and utilizing light signals for interconnection, a computer of high performance can be made for pseudo-organic systems.

Figure 12:
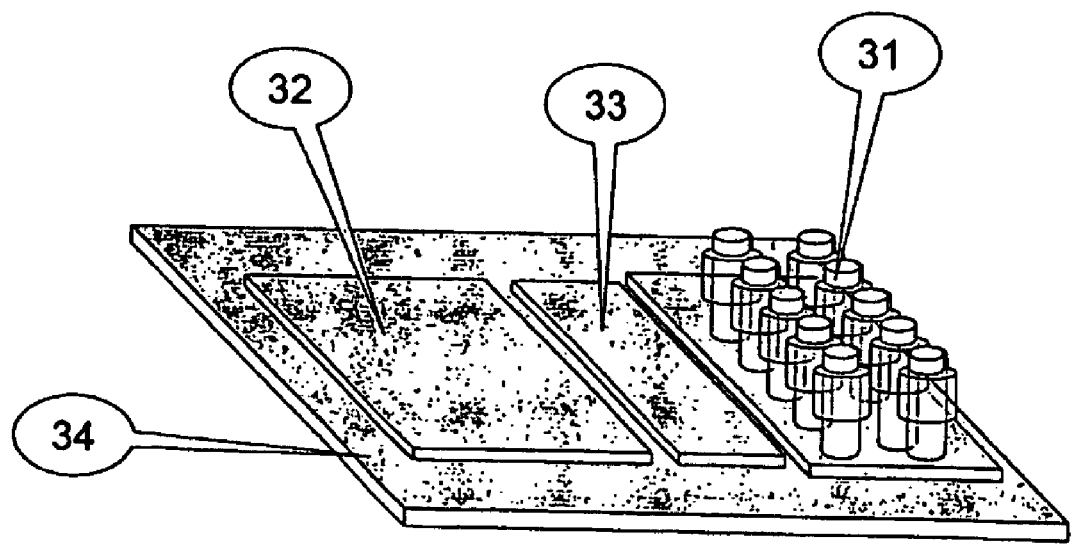
FIG. 12 is a diagram showing standard matrix module.
Figure 13:
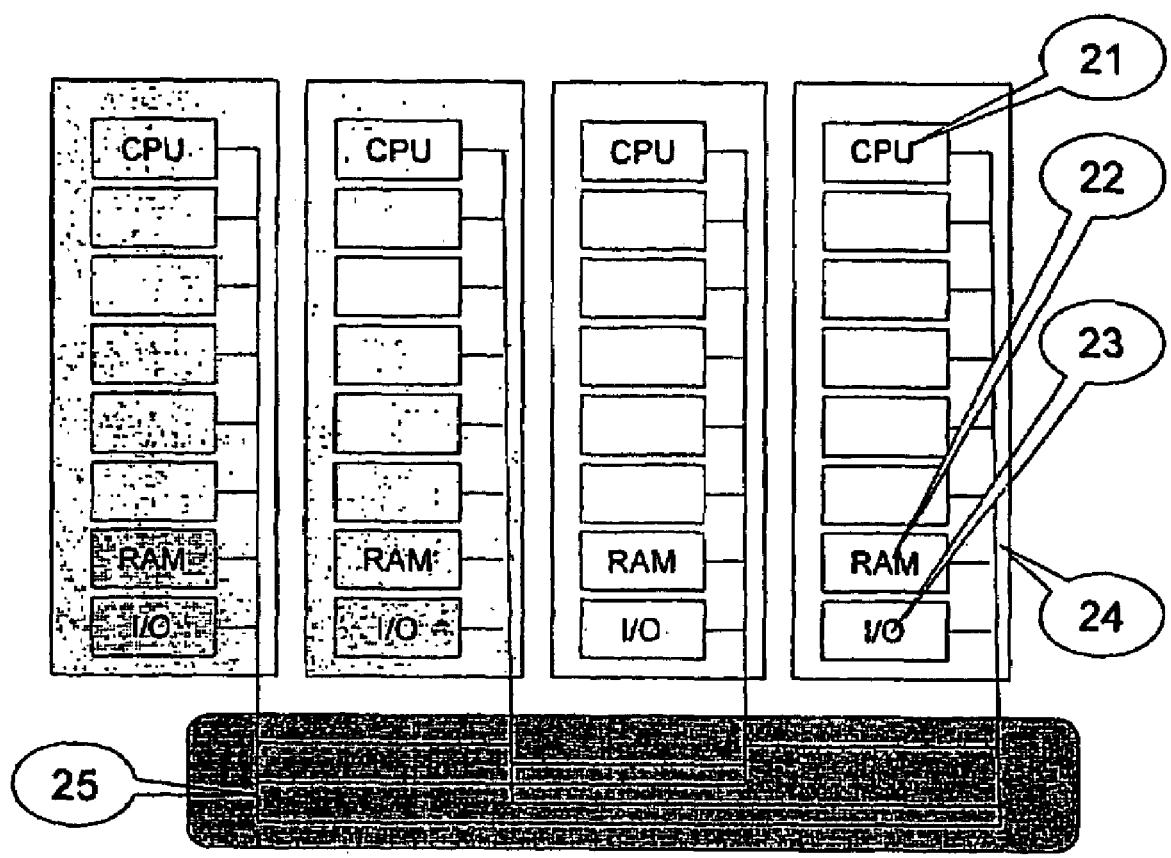
FIG. 13 is a MPP diagram showing a group of computers with a plenty of chips.

When producing in a small scale, the production cost will be higher, if a photoelectrically coupled assemble is integrated to every chip to form bus matrix. For this reason, several standard bus matrix 31 may be produced in batches, and then a module 34 is formed by soldering bus matrixes with the general purpose chips 32. In order to have much flexibility, a programmable switching array 33 is inserted between the chip and the matrix. (as shown in FIG. 12). FIG. 13 shows a node 24 consisting of 6 CPU chips 21, RAM 22, I/O 23 etc which are connected by the laser bus, and a super metric matrix 25 consisting of four nodes which are connected by 6 buses, in which a plenty of CPU, RAM, I/O and same or different type of chips are connected together. As a result, high speed connection may be provided in an unlimited manner.

A Laser emitter constructed of the end of the above mentioned optical channel bus matrix output may be used as a projector screen by imaging lens.

The invention claimed is:

1. A diffusion and laser photoelectrically coupled integrated circuit signal bus, wherein the signal bus connecting all the chips is comprised of an optical channel, which is constructed of a string of send-receiving photosensitive modules at the corresponding position and extended through all the stacked chips, wherein a hollow light emitting body made of light emitting units is disposed on the integrated circuit chip; a hollow reflective sheet is located on the bottom surface of the chip and under the light emitting body; a send-receiving photosensitive module is disposed around the light emitting body; a hollow reflective sheet or a semitransparent diffusion sheet is placed over the light emitting body; and the same processed chips are stacked up.

2. The diffusion and laser photoelectrically coupled integrated circuit signal bus of claim 1, wherein bus matrixes formed in such a manner that the optical channel bus is arranged in an array manner on the integrated circuit chips are used as signal lines connecting integrated circuits.

3. The diffusion and laser photoelectrically coupled integrated circuit signal bus of claim 1 wherein a cylindrical refraction layer and absorption layer are mounted on the outer wall of the bus.

4. The integrated circuit signal bus of claim 2, wherein a laser emitter consisting of the output end of the optical channel bus matrixes may be used as a projector screen by means of imaging lens.

5. The diffusion and laser photoelectrically coupled integrated circuit signal bus of claim 2, wherein a cylindrical refraction layer and an absorption layer are mounted on the outer wall of the bus.

* * * * *